(12) United States Patent
Lee et al.

(10) Patent No.: US 8,803,336 B2
(45) Date of Patent: Aug. 12, 2014

(54) SEMICONDUCTOR PACKAGE

(71) Applicant: SK hynix Inc., Icheon-si (KR)

(72) Inventors: Sang Eun Lee, Icheon-si (KR); Sung Soo Ryu, Seongnam-si (KR); Chang Il Kim, Busan (KR); Seon Kwang Jeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/799,362

(22) Filed: Mar. 13, 2013

(65) Prior Publication Data

US 2014/0124921 A1     May 8, 2014

(30) Foreign Application Priority Data

Nov. 2, 2012 (KR) .......................... 10-2012-0123306

(51) Int. Cl.
*H01L 23/48* (2006.01)
*H01L 21/00* (2006.01)

(52) U.S. Cl.
USPC ............ 257/777; 257/E25.005; 257/E25.006; 257/E25.011; 257/E25.012; 257/E25.015; 257/E25.016; 257/E25.021; 257/E25.027; 257/E23.085; 438/109

(58) Field of Classification Search
USPC .......... 257/777, E25.055, E25.006, E25.011, 257/E25.012, E25.013, E25.015, E25.016, 257/E25.021, E25.027, E23.085; 438/109, 438/FOR. 368, FOR. 426
See application file for complete search history.

(56) References Cited

U.S. PATENT DOCUMENTS

| | | | |
|---|---|---|---|
| 6,348,728 B1 * | 2/2002 | Aiba et al. | 257/678 |
| 2008/0106860 A1 | 5/2008 | Jafari et al. | |
| 2013/0113115 A1 * | 5/2013 | Wang et al. | 257/777 |

* cited by examiner

*Primary Examiner* — Jasmine Clark

(74) *Attorney, Agent, or Firm* — William Park & Associates Patent Ltd.

(57) ABSTRACT

A semiconductor package includes a substrate; a driving chip having first bumps on a first surface and bump pads on a second surface facing away from the first surface, and mounted to the substrate by the medium of the first bumps; a support member disposed on the substrate substantially horizontally with respect to the driving chip; and a plurality of memory chips substantially horizontally disposed on the driving chip and the support member such that one corner portions of the memory chips are positioned on the driving chip while being centered about the driving chip, wherein the respective memory chips have second bumps which are electrically connected with the respective bump pads of the driving chip, on one surfaces of the one corner portions of the memory chips which face the driving chip.

9 Claims, 8 Drawing Sheets

SEMICONDUCTOR PACKAGE

CROSS-REFERENCE TO RELATED APPLICATIONS

The present application claims priority to Korean Patent Application Number 10-2012-0123306 filed on Nov. 2, 2012 in the Korean Intellectual Property Office, which is incorporated herein by reference in its entirety.

BACKGROUND

1. Field of Invention

The present invention generally relates to a semiconductor package, and more particularly, to a semiconductor package which has a novel shape capable of accomplishing a light, thin, compact and miniaturized structure.

2. Description of the Related Art

Recently, as the development of the electronic industry is rapidly progressed and light weight, miniaturization and multi-functionality of electronic products are required, an incorporated type semiconductor package in which a driving chip and a memory chip are constructed in one module has been developed. As a kind of the incorporated type semiconductor package, a structure in which a driving chip and a memory chip are fabricated as separate packages and the packages are vertically stacked or horizontally mounted on a mother board has been suggested.

FIGS. 1 and 2 are cross-sectional views illustrating conventional semiconductor packages. FIG. 1 is a cross-sectional view illustrating a structure in which a driving package 10 and a memory package 20 are vertically stacked, and FIG. 2 is a cross-sectional view illustrating a structure in which a driving package 10 and a memory package 20 are horizontally mounted on a mother board 30.

However, in the case where the driving package 10 and the memory package 20 are vertically stacked, problems are caused in that a signal transfer path between the driving package 10 and the memory package 20 is lengthened and complicated, and, in the case where the driving package 10 and the memory package 20 are horizontally mounted on the mother board 30, problems are caused in that the area of the mother board 30 occupied by the driving package 10 and the memory package 20 increases and it is difficult to accomplish miniaturization.

Additionally, in the memory package 20, in order to realize a product with a memory capacity at least two times larger than a memory capacity obtainable through a semiconductor integration process, at least two memory chips 2 are stacked, and the stacked memory chips 2 and a substrate 3 are connected using wires W. After forming the wires W, in order to protect the memory package 20, a molding part 5 is formed to seal the upper surface of the substrate 3 including the stacked memory chips 2.

While the wires W should have loops to define spaces for preventing short-circuiting with the peripheries of the memory chips 2, the size of the memory package 20 increases due to the presence of the wire loops and miniaturization is difficult to accomplish. Also, difficulties care caused in that a spacer 4 should be additionally formed between the stacked memory chips 2 to secure the height of the wire loops.

Also, as the number of stacked memory chips 2 increases, the height of the wire loops which are formed on the upper surface of the memory chip increases, and thus, limitations exist in increasing the number of memory chips 2 to be stacked. Moreover, as the number of stacked memory chips 2 increases, the length of wires W increases, and thus, problems are likely to be frequently caused due to wire sweeping, wire damage and short-circuiting between the peripheries of the memory chips 2 and the wires W during a process for forming the molding part 5. In addition, since the wires W should be formed using gold which is expensive, the package fabrication cost is increased.

In the case of grinding the memory chips 2 as thin as possible, although the number of memory chips 2 to be stacked may be increased, a fail such as a warpage and a crack is likely to occur.

SUMMARY

Various embodiments are directed to a semiconductor package which has a novel shape capable of accomplishing a light, thin, compact and miniaturized structure.

In an embodiment, a semiconductor package may include: a substrate; a driving chip having first bumps on a first surface and bump pads on a second surface facing away from the first surface, and mounted to the substrate by the medium of the first bumps; a support member disposed on the substrate substantially horizontal with respect to the driving chip; and a plurality of memory chips substantially horizontal disposed on the driving chip and the support member such that one corner portions of the memory chips are positioned on the driving chip while being centered about the driving chip, wherein the respective memory chips have second bumps which are electrically connected with the respective bump pads of the driving chip and are disposed one surfaces of the one corner portions of the memory chips which face the driving chip.

The plurality of memory chips may be disposed in a matrix type when viewed from the top, and the plurality of memory chips may be arranged such that their major axes are aligned in lines which extend substantially parallel to each other. Additionally, the plurality of memory chips may have substantially the same structure, and may be disposed in such a manner that the memory chips define a rotational symmetry about the driving chip such that one corner portions of the memory chips on which the second bumps are positioned, are placed on the driving chip.

The second bumps of the respective memory chips may be disposed adjacent to long sides of the respective memory chips on the one surfaces of the one corner portions of the memory chips which face the driving chip. Additionally, the second bumps of the respective memory chips may be disposed adjacent to short sides of the respective memory chips on the one surfaces of the one corner portions of the memory chips which face the driving chip, or may be disposed substantially in L-shaped forms adjacent to long sides and short sides of the respective memory chips on the one surfaces of the one corner portions of the memory chips which face the driving chip.

The semiconductor package may further include: a molding part sealing an upper surface of the substrate including the driving chip, the support member and the plurality of memory chips; and external connection terminals mounted to a lower surface of the substrate, wherein the molding part includes an epoxy molding compound.

DETAILED DESCRIPTION

Figure 1:
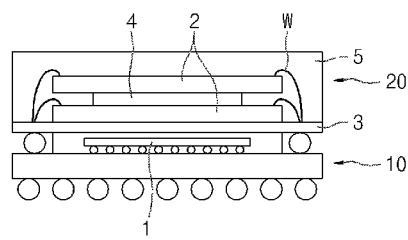
FIGS. 1 and 2 are cross-sectional views illustrating conventional semiconductor packages.
Figure 2:
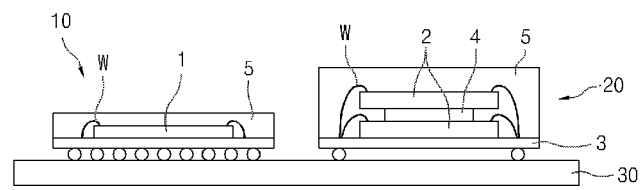

Hereafter, various embodiments will be described in detail with reference to the accompanying drawings.

It is to be understood herein that the drawings are not necessarily to scale and in some instances proportions may have been exaggerated in order to more clearly depict certain features of the invention. Also, the same reference numerals or the same reference designators may denote the same elements throughout the specification.

Figure 3:
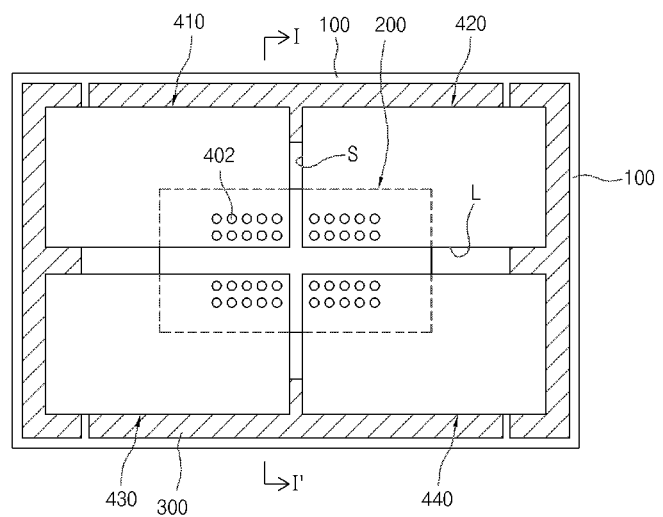
FIG. 3 is a plan view illustrating a semiconductor package in accordance with a first embodiment.
Figure 4:
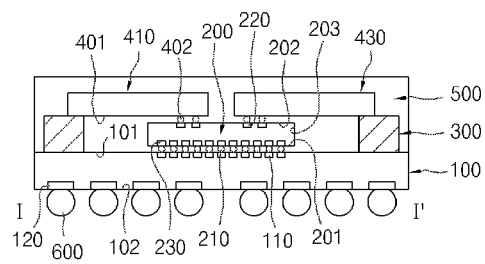
FIG. 4 is a cross-sectional view taken along the line I-I' of FIG. 3.

FIG. 3 is a plan view illustrating a semiconductor package in accordance with a first embodiment, and FIG. 4 is a cross-sectional view taken along the line I-I' of FIG. 3.

Referring to FIGS. 3 and 4, the semiconductor package in accordance with the first embodiment may include a substrate 100, a driving chip 200, a support member 300, and a plurality of memory chips 410, 420, 430 and 440. Besides, the semiconductor package further may include a molding part 500 and external connection terminals 600.

The substrate 100 has an upper surface 101 and a lower surface 102 which faces away from the upper surface 101. Connection pads 110 may be formed on the upper surface 101 of the substrate 100, and ball lands 120 may be formed on the lower surface 102 of the substrate 100. The external connection terminals 600 such as solder balls may be mounted to the ball lands 120.

The driving chip 200 has a first surface 201, a second surface 202 which faces away from the first surface 201, and side surfaces 203 which connect the first surface 201 and the second surface 202. The driving chip 200 may include a plurality of first bumps 210, a plurality of bump pads 220, and a plurality of bonding pads 230.

The bonding pads 230 may be formed on the first surface 201 of the driving chip 200, and the first bumps 210 may be formed on the respective bonding pads 230. The bump pads 220 may be formed on the second surface 202 of the driving chip 200 and are electrically connected with the bonding pads 230. While not shown, in order for electrical connection between the bump pads 220 positioned on the second surface 202 of the driving chip 200 and the bonding pads 230 positioned on the first surface 201 of the driving chip 200, the driving chip 200 may include through vias (not shown) which pass through the first surface 201 and the second surface 202 and are electrically connected with the respective bonding pads 230 and redistribution lines (not shown) which may be formed on the second surface 202 of the driving chip 200 and electrically connect the through vias with the respective bump pads 220. Additionally, the bump pads 220 and the bonding pads 230 may be connected with each other only using redistribution lines without using through vias. In this case, one ends of the respective redistribution lines are connected with the bonding pads 230 on the first surface 201 of the driving chip 200, and the other ends of the respective redistribution lines which face away from the one ends extend to the second surface 202 of the driving chip 200 over the side surfaces 203 of the driving chip 200 and are connected with the bump pads 220 on the second surface 202 of the driving chip 200.

The driving chip 200 may be mounted to the substrate 100 such that the first bumps 210 are respectively connected with the connection pads 110 of the substrate 100.

The support member 300 is to support the memory chips 410, 420, 430 and 440 and may be substantially disposed horizontally with respect to the driving chip 200 on the substrate 100.

The plurality of memory chips 410, 420, 430 and 440 may include first, second, third and fourth memory chips 410, 420, 430 and 440. The first, second, third and fourth memory chips 410, 420, 430 and 440 may be substantially disposed horizontally on the driving chip 200 and the support member 300 such that respective one corner portions of the first, second, third and fourth memory chips 410, 420, 430 and 440 are positioned on the driving chip 200 while being centered about the driving chip 200. In the present embodiment, the first, second, third and fourth memory chips 410, 420, 430 and 440 are disposed in a matrix type when viewed from the top and are arranged such that their major axes, that is their long axes, are aligned in lines which extend substantially parallel to each other.

The first, second, third and fourth memory chips 410, 420, 430 and 440 have second bumps 402 which are electrically connected with the bump pads 220 of the driving chip 200, on one surfaces 401 of the one corner portions which face the driving chip 200. In the present embodiment, the second bumps 402 of the first, second, third and fourth memory chips 410, 420, 430 and 440 are disposed adjacent to long sides L of the respective first, second, third and fourth memory chips 410, 420, 430 and 440 on the one surfaces 401 of the one corner portions of the first, second, third and fourth memory chips 410, 420, 430 and 440 which face the driving chip 200.

The molding part 500 seals the upper surface 101 of the substrate 100 including the driving chip 200, the support member 300 and the plurality of memory chips 410, 420, 430 and 440. The molding part 500 may include an epoxy molding compound (EMC).

According to the present embodiment, since memory chips and a driving chip are constructed in one package, the area of a main board may be reduced, and it is possible to avoid cumbersomeness in process that is otherwise caused due to necessities to fabricate the memory chips and the driving chip as separate packages and individually mount the separate packages. Further, since a signal transfer length is shortened as the memory chips and the driving chip are directly connected, an operation speed may be improved. In addition, because wire bonding is not needed, it is possible to prevent the occurrence of problems due to wire bonding, that is, an increase in the size of a package, a cost raise resulting from the use of costly gold wires, a defect resulting from the use of wires, and difficulties resulting from the formation of spacers and redistribution lines. Moreover, due to the fact that an area of the driving chip that is occupied by one memory chip is minimized, since the number of memory chips capable of being mounted on the driving chip is increased, the memory capacity of the semiconductor package is increased, and, since a reduction in the size of the driving chip is made possible, the number of driving chips capable of being fabricated in a single wafer, that is, the net die of driving chips, may be increased.

It is to be noted that the present invention is not limited to the aforementioned first embodiment and modifications may be made in a variety of ways. For example, the position of the second bumps 402 may be changed, and the structure and layout type of the memory chips 410, 420, 430 and 440 may also be changed. Various such semiconductor packages will be apparent from the following embodiments which will be described with reference to FIGS. 5 to 14.

Figure 5:
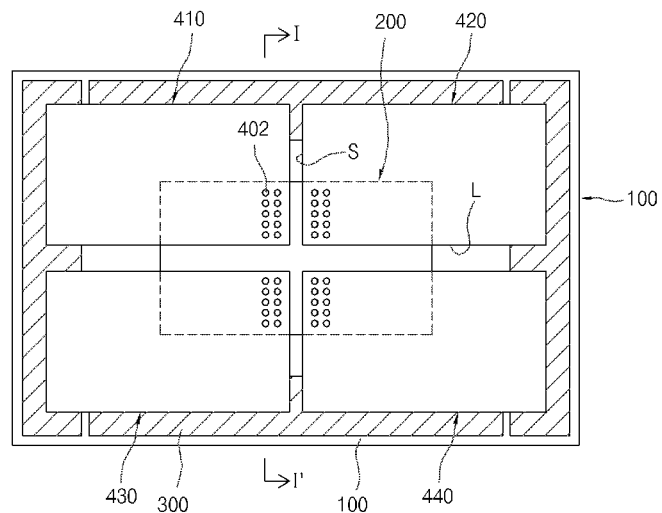
FIG. 5 is a plan view illustrating a semiconductor package in accordance with a second embodiment.
Figure 6:
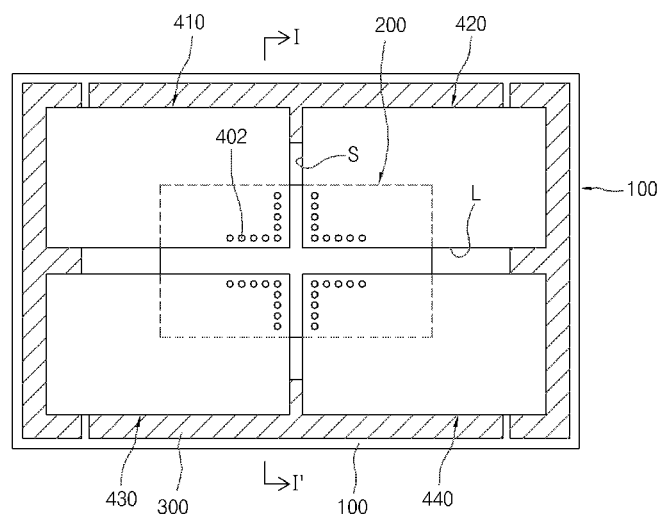
FIG. 6 is a plan view illustrating a semiconductor package in accordance with a third embodiment.

FIG. 5 is a plan view illustrating a semiconductor package in accordance with a second embodiment, and FIG. 6 is a plan view illustrating a semiconductor package in accordance with a third embodiment.

The semiconductor packages in accordance with the second and third embodiments have constructions where the position of second bumps 402 is changed, unlike the first embodiment described above with reference to FIGS. 3 and 4. That is to say, the semiconductor packages in accordance with the second and third embodiments have substantially the same construction as the semiconductor package in accordance with the first embodiment except the second bumps 402. Therefore, repeated descriptions for the same component parts will be omitted herein, and the same terms and the same reference numerals will be used to refer to the same component parts.

Referring to FIG. 5, second bumps 420 of respective first, second, third and fourth memory chips 410, 420, 430 and 440 may be disposed adjacent to short sides S of the respective first, second, third and fourth memory chips 410, 420, 430 and 440 on one surfaces 401 of one corner portions of the first, second, third and fourth memory chips 410, 420, 430 and 440 which face a driving chip 200. Additionally, referring to FIG. 6, second bumps 420 of respective first, second, third and fourth memory chips 410, 420, 430 and 440 may be disposed substantially in a L-shaped form adjacent to the long sides L and the short sides S of the respective first, second, third and fourth memory chips 410, 420, 430 and 440 on the one surfaces 401 of one corner portions of the first, second, third and fourth memory chips 410, 420, 430 and 440 which face a driving chip 200.

Figure 7:
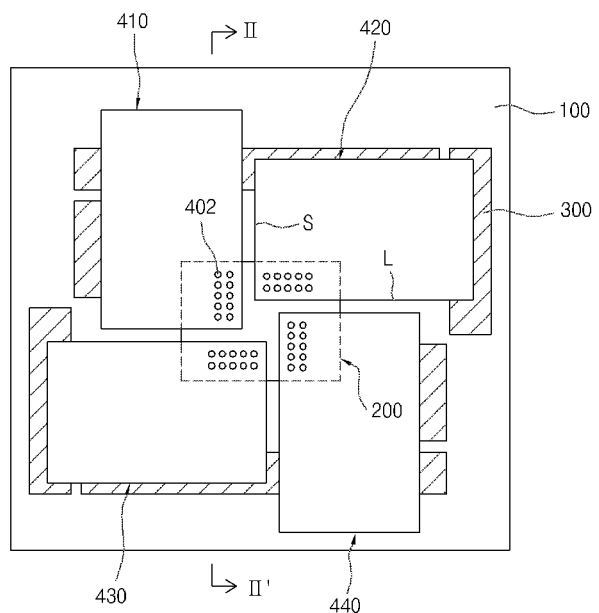
FIG. 7 is a plan view illustrating a semiconductor package in accordance with a fourth embodiment.
Figure 8:
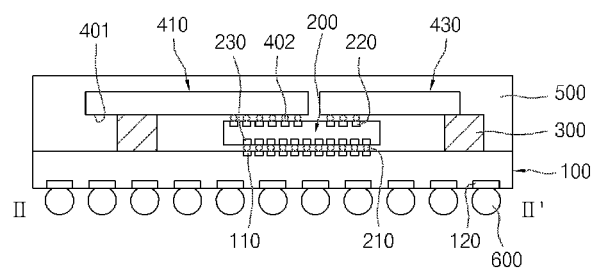
FIG. 8 is a cross-sectional view taken along the line II-II' of FIG. 7.

FIG. 7 is a plan view illustrating a semiconductor package in accordance with a fourth embodiment, and FIG. 8 is a cross-sectional view taken along the line II-II' of FIG. 7.

The semiconductor package in accordance with the fourth embodiment has a construction that the structure and layout type of first, second, third and fourth memory chips 410, 420, 430 and 440 are changed, unlike the first embodiment described above with reference to FIGS. 3 and 4. That is to say, the semiconductor package in accordance with the fourth embodiment has substantially the same construction as the semiconductor package in accordance with the first embodiment except the first, second, third and fourth memory chips 410, 420, 430 and 440. Therefore, repeated descriptions for the same component parts will be omitted herein, and the same terms and the same reference numerals will be used to refer to the same component parts.

Referring to FIGS. 7 and 8, in the present embodiment, first, second, third and fourth memory chips 410, 420, 430 and 440 have the same structure, and are disposed in such a manner that the first, second, third and fourth memory chips 410, 420, 430 and 440 define a rotational symmetry about a driving chip 200 in such a way as to allow one corner portions of the first, second, third and fourth memory chips 410, 420, 430 and 440 on which second bumps 402 are positioned, to be placed on the driving chip 200.

According to the present embodiment, since a package may be fabricated using memory chips with substantially the same structure, it is possible to prevent difficulties which are likely to be caused due to necessities to fabricate and handle memory chips with different structures.

Figure 9:
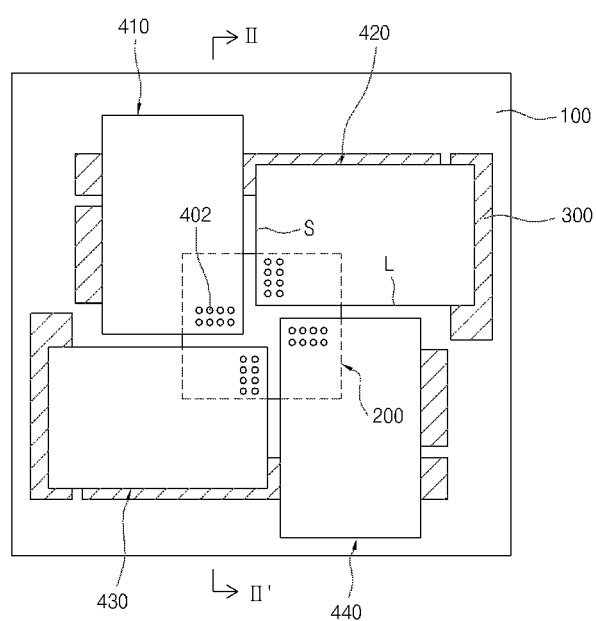
FIG. 9 is a plan view illustrating a semiconductor package in accordance with a fifth embodiment.
Figure 10:
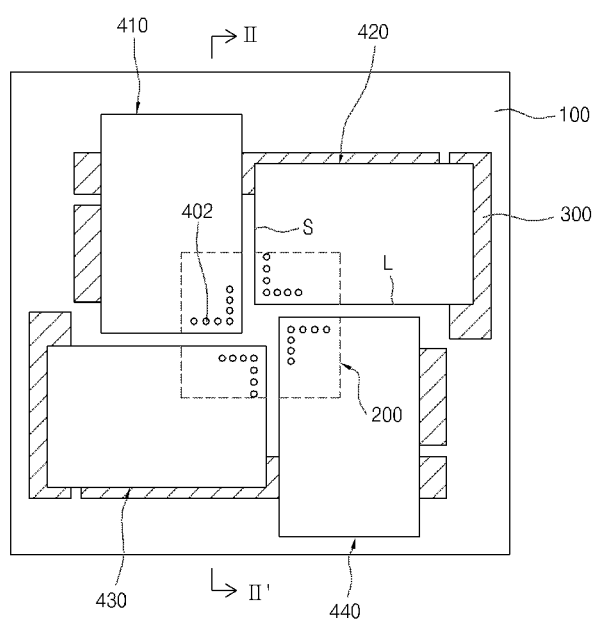
FIG. 10 is a plan view illustrating a semiconductor package in accordance with a sixth embodiment.

FIG. 9 is a plan view illustrating a semiconductor package in accordance with a fifth embodiment, and FIG. 10 is a plan view illustrating a semiconductor package in accordance with a sixth embodiment.

The semiconductor packages in accordance with the fifth and sixth embodiments have constructions that the position of second bumps 402 is changed, unlike the fourth embodiment described above with reference to FIGS. 7 and 8. That is to say, the semiconductor packages in accordance with the fifth and sixth embodiments have substantially the same construction as the semiconductor package in accordance with the fourth embodiment except the second bumps 402. Therefore, repeated descriptions for the same component parts will be omitted herein, and the same terms and the same reference numerals will be used to refer to the same component parts.

Referring to FIG. 9, second bumps 402 of respective first, second, third and fourth memory chips 410, 420, 430 and 440 may be disposed adjacent to short sides S of the respective first, second, third and fourth memory chips 410, 420, 430 and 440 on one surfaces 401 of one corner portions of the first, second, third and fourth memory chips 410, 420, 430 and 440 which face a driving chip 200. Additionally, referring to FIG. 10, second bumps 402 of respective first, second, third and fourth memory chips 410, 420, 430 and 440 may be disposed in L-shaped forms adjacent to long sides L and short sides S of the respective first, second, third and fourth memory chips 410, 420, 430 and 440 on one surfaces 401 of one corner portions of the first, second, third and fourth memory chips 410, 420, 430 and 440 which face a driving chip 200.

The semiconductor packages according to the above-described embodiments may be applied to various electronic apparatuses.

Figure 11:
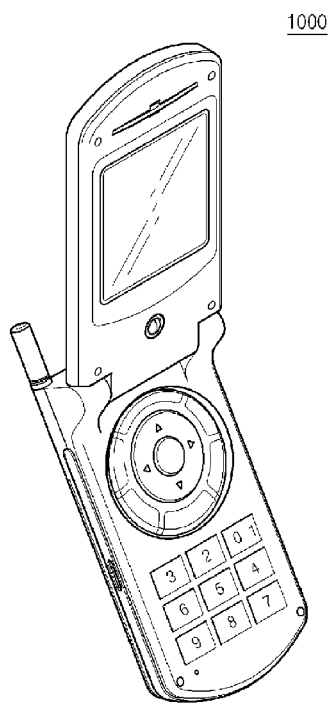
FIG. 11 is a perspective view illustrating an electronic apparatus having the semiconductor package according to the various embodiments.

FIG. 11 is a perspective view illustrating an electronic apparatus having the semiconductor package according to the various embodiments.

Referring to FIG. 11, the semiconductor package according to the various embodiments may be applied to an electronic apparatus 1000 such as a portable phone. Since the semiconductor package according to the various embodiments provides benefits in that it is possible to accomplish a light, slim, compact and miniaturized structure and increase a memory capacity, advantages are provided in terms of reducing the size and increasing the storage capacity of the electronic apparatus 1000. The electronic apparatus 1000 is not limited to the portable phone shown in FIG. 11, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth. Also, the semiconductor package according to the various embodiments may be applied to an SD (secure digital) card, a memory stick, an MMC (multi-media card), a CF (compact flash), an SSD (solid state drive), etc., which are used in electronic apparatuses.

Figure 12:
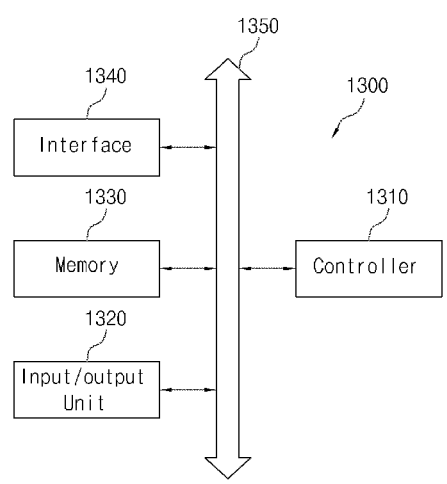
FIG. 12 is a block diagram showing an example of the electronic apparatus having the semiconductor package according to the various embodiments.

FIG. 12 is a block diagram showing an example of the electronic apparatus having the semiconductor package according to the various embodiments.

Referring to FIG. 12, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the semiconductor package according to the various embodiments. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

Although various embodiments have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
    a substrate;
    a driving chip having a first surface on which first bumps are formed and a second surface facing away from the first surface and on which bump pads are formed, wherein the driving chip is configured to mount on the substrate using the first bumps as an electrically connected member;
    a support member disposed on the substrate substantially horizontal with respect to the driving chip; and
    a plurality of memory chips substantially horizontal disposed on the driving chip and the support member such that one corner portions of the memory chips are positioned on the driving chip while being centered about the driving chip,
    wherein each of the memory chips has second bumps which are electrically connected with the bump pads of the driving chip, respectively and are disposed on one surfaces of the one corner portions of the memory chips which face the driving chip.

2. The semiconductor package according to claim 1, wherein the plurality of memory chips are disposed in a matrix type.

3. The semiconductor package according to claim 2, wherein the plurality of memory chips are arranged such that their long axes are aligned in lines which extend substantially parallel to each other.

4. The semiconductor package according to claim 1, wherein the plurality of memory chips have substantially a same structure, and are disposed in such a manner that the memory chips define a rotational symmetry about the driving chip such that the one corner portions of the memory chips on which the second bumps are positioned, are placed on the driving chip.

5. The semiconductor package according to claim 1, wherein the second bumps of each of the memory chips are disposed adjacent to long sides of the respective memory chips on the one surfaces of the one corner portions of the memory chips which face the driving chip.

6. The semiconductor package according to claim 1, wherein the second bumps of each of the memory chips are disposed adjacent to short sides of the respective memory chips on the one surfaces of the one corner portions of the memory chips which face the driving chip.

7. The semiconductor package according to claim 1, wherein the second bumps of each of the memory chips are disposed substantially in L-shaped forms adjacent to long sides and short sides of each of the memory chips on the one surfaces of the one corner portions of the memory chips which face the driving chip.

8. The semiconductor package according to claim 1, further comprising:
    a molding part sealing an upper surface of the substrate including the driving chip, the support member and the plurality of memory chips; and
    external connection terminals mounted to a lower surface of the substrate.

9. The semiconductor package according to claim 8, wherein the molding part comprises an epoxy molding compound.

* * * * *